US008529779B2

(12) United States Patent
Cheng et al.

(10) Patent No.: US 8,529,779 B2
(45) Date of Patent: *Sep. 10, 2013

(54) METHODS FOR FORMING SURFACE FEATURES USING SELF-ASSEMBLING MASKS

(75) Inventors: Joy Cheng, San Jose, CA (US); Mark W. Hart, San Jose, CA (US); Hiroshi Ito, San Jose, CA (US); Ho-Cheol Kim, San Jose, CA (US); Robert Miller, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 1061 days.

This patent is subject to a terminal disclaimer.

(21) Appl. No.: 12/057,565

(22) Filed: Mar. 28, 2008

(65) Prior Publication Data

US 2009/0107953 A1    Apr. 30, 2009

Related U.S. Application Data

(63) Continuation of application No. 11/926,722, filed on Oct. 29, 2007, now Pat. No. 7,828,986.

(51) Int. Cl.
*B31D 3/00* (2006.01)
*C03C 15/00* (2006.01)
*C03C 25/68* (2006.01)
*C23F 1/00* (2006.01)
*H01L 21/302* (2006.01)

(52) U.S. Cl.
USPC ............... 216/56; 216/41; 216/47; 216/49; 216/51; 438/717

(58) Field of Classification Search
USPC ............ 216/41, 47–49, 51, 58, 56; 438/689, 438/717

See application file for complete search history.

(56) References Cited

U.S. PATENT DOCUMENTS 5,260,172 A * 11/1993 Ito .................................. 430/323
5,290,397 A    3/1994 Ober et al.
6,518,194 B2   2/2003 Winningham et al.

(Continued)

OTHER PUBLICATIONS

Sundström et al "Patterning ~20 nm half-pitch lines on silicon using a self-assembled organosilicate etch mask" Jan. 27, 2006. Applied Physics Letters 88 243107.*

(Continued)

*Primary Examiner* — Allan Olsen
*Assistant Examiner* — Margaret D Klunk
(74) *Attorney, Agent, or Firm* — Schmeiser, Olsen & Watts, LLP; Daniel E. Johnson (57) ABSTRACT

A method for producing surface features and an etch masking method. A combination is provided of a block copolymer and additional material. The block copolymer includes a first block of a first polymer covalently bonded to a second block of a second polymer. The additional material is miscible with the first polymer. A film is formed of the combination directly onto a surface of a first layer. Nanostructures of the additional material self-assemble within the first polymer block. The film of the combination and the first layer are etched. The nanostructures have an etch rate lower than an etch rate of the block copolymer and lower than an etch rate of the first layer. The film is removed and features remain on the surface of the first layer. Also included is an etch masking method where the nanostructures mask portions of the first layer from said etchant.

20 Claims, 6 Drawing Sheets

(56) References Cited

U.S. PATENT DOCUMENTS

| | | | |
|---|---|---|---|
| 6,565,763 B1* | 5/2003 | Asakawa et al. | 216/56 |
| 6,720,061 B1 | 4/2004 | Port et al. | |
| 6,893,705 B2 | 5/2005 | Thomas et al. | |
| 7,037,744 B2 | 5/2006 | Colburn et al. | |
| 7,090,784 B2 | 8/2006 | Asakawa et al. | |
| 7,828,986 B2* | 11/2010 | Cheng et al. | 216/58 |
| 2003/0175534 A1* | 9/2003 | Chen et al. | 428/447 |
| 2004/0087176 A1 | 5/2004 | Colburn et al. | |
| 2004/0127001 A1 | 7/2004 | Colburn et al. | |
| 2004/0164293 A1* | 8/2004 | Maloney et al. | 257/40 |
| 2005/0079719 A1 | 4/2005 | Colburn et al. | |
| 2005/0124172 A1 | 6/2005 | Townsend, III et al. | |
| 2006/0134556 A1* | 6/2006 | Nealey et al. | 430/311 |
| 2006/0231525 A1* | 10/2006 | Asakawa et al. | 216/56 |
| 2007/0289943 A1* | 12/2007 | Lu et al. | 216/41 |
| 2008/0103256 A1* | 5/2008 | Kim et al. | 525/88 |
| 2009/0170342 A1 | 7/2009 | Kim et al. | |

OTHER PUBLICATIONS

Jung et al. "Orientation-controlled self-assembled nanolithography using a polystyrene-polydimethoxysilane block copolymer" Apr. 19, 2007 Nano Letters vol. 7 No. 7 2046-2050.*

Notice of Allowance (Mail Date Jul. 2, 2010) for U.S. Appl. No. 11/926,722, filed Oct. 29, 2007.

Vlachopoulou, M. E., et al., "Plasma etching technology for fabrication and surface modification of plastic microfluidic devices", retrieved on Mar. 15, 2013 from the Internet: <URL: http://www.ispc-conference.org/ispcproc/papers/678.pdf> (hereinafter, "PlasmaEtching"); 4 pages.

"Plama sources for high-rate etching of SiC", retrieved on Mar. 15, 2013 from the Internet: <URL: http://www.electroiq.com/articles/sst/print/volume-48/issue-5/features/mems/plasma-sources-for-high-rate-etching-of-sic.html> (hereinafter, "PlasmaSources"); 6 pages.

Sung Ho Han; Advanced A1 Damascene Process for Fine Trench under 70nm Design Rule; Mater. Res. Soc. Symp. Proc. vol. 863 © 2005 Materials Research Society; pp. B8.23.1-B8.23.6.

Freer et al.; Oriented Mesoporous Organosilicate Thin Films; © 2005 American Chemical Society; Nano Letters 2005, vol. 5, No. 10; pp. 2014-2018.

Noguchi et al.; Simple Self-Aligned Air-Gap Interconnect Process with Cu/FSG Structure; 3 pages, Proc. of IEEE 2003 International Interconnect Tech. Conf. 2003, Jun. 2-4, 2003.

Gosset et al.; General review of issues and perspectives for advanced copper interconnections using air gap as ultra-low K material; 3 pages, Proc. of IEEE 2003 International Interconnect Tech. Conf. 2003, Jun. 2-4, 2003.

Uno et al.; Dual Damascene Process for Air-Gap Cu Interconnects Using Conventional CVD Films as Sacrificial Layers; 3 pages, Proc. of IEEE 2005 International Interconnect. Tech. Conf. 2003, Jun. 6-8, 2005.

J.P. Gueneau De Mussy et al.; Novel Selective Sidewall Airgap Process; 3 pages, Proc. of IEEE 2005 International Interconnect Tech. Conf. 2003, Jun. 6-8, 2005.

Daamen at al.; Air Gap Integration for the 45 nm Node and Beyond; 3 pages, Proc. of IEEE 2005 International Interconnect Tech. Cont. 2003, Jun. 6-8, 2003.

* cited by examiner

| PS (kilograms/mole) | PEO (kilograms/mole) | Nanopore diameter (nanometers) |
| --- | --- | --- |
| 19.0 | 12.3 | 25 |
| 9.5 | 9.5 | 15 |
| 3.8 | 4.8 | 8 |

FIG.6

METHODS FOR FORMING SURFACE FEATURES USING SELF-ASSEMBLING MASKS

This application is a continuation application claiming priority from Ser. No. 11/926,722 filed Oct. 29, 2007, now U.S. Pat. No. 7,828,986, issued Nov. 9, 2010.

FIELD OF THE INVENTION

The invention generally relates to methods of masking and formation of surface structures in semiconductor materials.

BACKGROUND OF THE INVENTION

As integrated circuit dimensions continue to decrease, resistive capacitive (RC) delay, crosstalk noise, and power dissipation of the interconnect structure may become limiting factors for ultra-large-scale integration of integrated circuits. Materials with low dielectric constants may be used to replace silicon dioxide as inter-metal dielectrics. Alternatively, air bridge (gap) structures may replace the dielectrics surrounding the metal wire, where air, in principle, may provide an even lower dielectric constant. Current integration schemes employing air gaps may utilize methods employing removal of a sacrificial organic polymer, high pressure chemical vapor deposition (CVD) to pinch off formed air gaps at the entrance providing a capped structure, or multi-layered structures combined with multi-step lithographic exposure, developing, and etching. There exists a need for a method having reduced complexity for producing nanoscale air gap structures.

SUMMARY OF THE INVENTION

The present invention relates to a method for producing surface features, comprising:

providing a combination of a block copolymer with additional material, said block copolymer comprising a first block of a first polymer, said first block being covalently bonded to a second block of a second polymer to form a repeating unit of the block copolymer, said first and second polymers being different, said additional material being miscible with said first polymer;

adhering a first layer onto a surface of a substrate, wherein said first layer comprises an organic compound;

forming a film of said combination directly onto a surface of said first layer, wherein in response to said forming, nanostructures of said additional material self-assemble within said first polymer block, said nanostructures self-aligning perpendicular to said surface of said first layer; and etching said film of said combination and said first layer, said nanostructures having an etch rate lower than an etch rate of said block copolymer, said nanostructures having an etch rate lower than an etch rate of said first layer, wherein said film is removed and features remain on said surface of said first layer after said etching.

The present invention relates to an etch masking method, comprising:

forming a first film on a surface of a substrate, wherein said first film comprises an organic compound;

forming a second film over said first film, said second film comprising a combination of a block copolymer and an inorganic material, said block copolymer comprising a first block of a first polymer and a second block of a second polymer, said inorganic material selectively miscible in said first block of said first polymer, wherein nanostructures of said inorganic material self-assemble in said first block of said block copolymer after said forming said second film; and etching by an etchant simultaneously said block copolymer and said first film, wherein said nanostructures mask portions of said first film from said etchant, said nanostructures having an etch rate lower than said first film and said nanostructures having an etch rate lower than said block copolymer.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings.

DETAILED DESCRIPTION OF THE INVENTION

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as examples of embodiments. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

A monomer as used herein is a molecule that can undergo polymerization thereby contributing constitutional units to the essential structure of a macromolecule, an oligomer, a block, a polymer, a chain, and the like.

A polymer as used herein is a macromolecule comprising multiple repeating smaller units or molecules (monomers) derived, actually or conceptually, from smaller units or molecules, bonded together covalently or otherwise. The polymer may be natural or synthetic.

A copolymer as used herein is a polymer derived from more than one species of monomer.

A block copolymer as used herein is a copolymer that comprises more than one species of monomer, wherein the monomers are present in blocks. Each block of the monomer comprises repeating sequences of the monomer. A formula (1) representative of a block copolymer is shown below:

$$(A)_a\text{-}(B)_b\text{-}(C)_c\text{-}(D)_d \quad (1)$$

wherein A, B, C, and D represent monomer units and the subscripts "a", "b", "c", and "d", represent the number of repeating units of A, B, C, and D respectively. The above referenced representative formula is not meant to limit the structure of the block copolymer used in an embodiment of the present invention. The aforementioned monomers of the copolymer may be used individually and in combinations thereof in accordance with the method of the present invention.

In one example, a block copolymer may have blocks of two different polymers. A formula (2) representative of such a block copolymer is shown below:

$$(A)_m\text{-}(B)_n \quad (2)$$

where subscripts "m" and "n" represent the number of repeating units of A and B, respectively. The notation for such a block copolymer may be abbreviated as A-b-B, where A represents the polymer of the first block, B represents the polymer of the second block, and -b-denotes that it is a block copolymer of blocks of A and B. For example, PS-b-PEO may represent a block copolymer of polystyrene (PS) and poly (ethylene oxide) (PEO).

A crosslinkable polymer as used herein is a polymer having a region in the polymer from which at least one polymer chain may emanate, and may be formed by reactions involving sites or groups on existing polymers or may be formed by interactions between existing polymers. The region may be an atom, a group of atoms, or a number of branch points connected by bonds, groups of atoms, or polymer chains. Typically, a crosslink is a covalent structure but the term is also used to describe sites of weaker chemical interactions, portions of crystallites, and even physical interactions such as phase separation and entanglements.

A nanostructure as used herein is a structure on the order of 1 nanometer (nm) to 500 nm in dimension. Examples of the structure may include but are not limited to nanorods, nanosheets, nanospheres, nanocylinders, nanocubes, nanoparticles, nanograins, nanofilaments, nanolamellae, and the like having solid composition and a minimal structural diameter in a range from about 1 nm to about 500 nm. Further examples of the structure may include but are not limited to spherical nanopores, cylindrical nanopores, nanotrenches, nanotunnels, nanovoids, and the like having their void or shape defined by the material or matrix that surrounds them and having a diameter in a range from about 1 nm to about 500 nm.

A substrate, as used herein, is a physical body (e.g., a layer or a laminate, a material, and the like) onto which a polymer or polymeric material may be deposited or adhered. A substrate may include materials of the IUPAC Group 11, 12, 13, and 14 elements; plastic material; silicon dioxide, glass, fused silica, mica, ceramic, metals deposited on the aforementioned substrates, combinations thereof, and the like. For example, a substrate may include a dielectric coated silicon wafer such as those used in semiconductor manufacturing.

Figure 1:
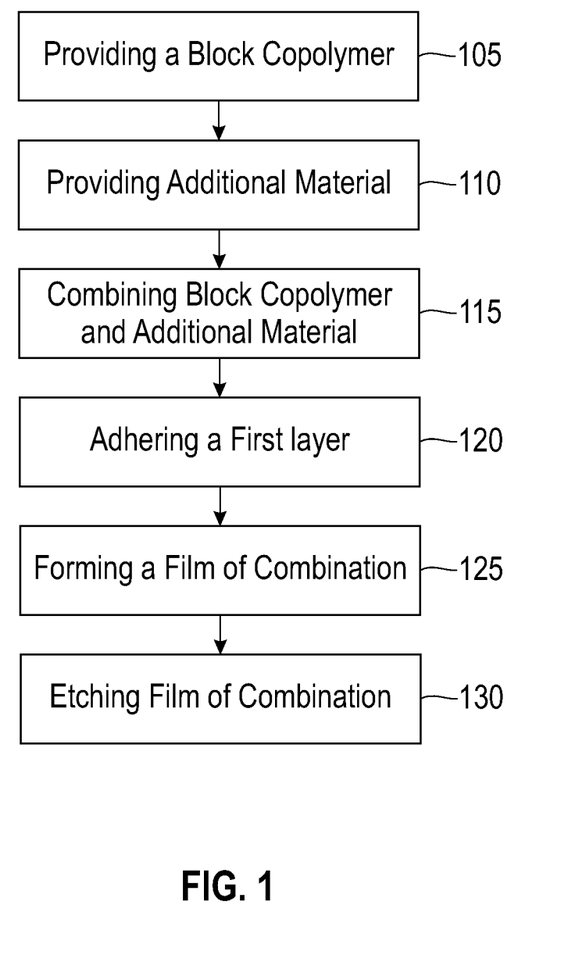
FIG. 1 is an illustration of a flow chart representing a method for producing surface features, in accordance with embodiments of the present invention.

FIG. 1 is an illustration of a flow chart representing a method for producing surface features. Step 105 provides a block copolymer, where the block copolymer may comprise a first block of a first polymer covalently bonded to a second block of a second polymer, where the first block and second block may be different. For example, the block copolymer may be a block copolymer of polystyrene and poly(ethylene oxide), PS-b-PEO.

The use of PS-b-PEO as the block copolymer is not meant to limit the type of the block copolymer that may be used in an embodiment of the present invention. The block copolymer may be an organic block copolymer. Specific examples of a first polymer may include but are not limited to poly(ethylene oxide) (or poly(ethylene glycol)), poly(propylene glycol), poly(alkylene oxides), poly(acrylic acids), poly(methacrylic acids), poly(dimethylamino ethylmethacrylates), poly(hydroxyalkyl methacrylates), poly(alkyleneoxide acrylates), poly(alkyleneoxide methacrylates), poly(hydroxystyrenes), polycarbohydrates, poly(vinyl alcohols), poly(ethylene imines), polyoxazolines, polypeptides, poly(vinyl pyridines), polyacrylamides, poly(methyl vinyl ethers), poly(vinyl carboxylic acid amides), poly(N,N-dimethylacrylamides), and the like. Specific examples of a second polymer may include but are not limited to polystyrene, poly($\alpha$-methylstyrene), polynorbornene, polylactones, polylactides, polybutadiene, polyisoprene, polyolefins, polymethacrylates, polysiloxanes, poly(alkyl acrylates), poly(alkyl methacrylates), polyacrylonitriles, polycarbonates, poly(vinyl acetates), poly(vinyl carbonates), polyisobutylenes, and the like. The block copolymer may be configured such that the first polymer and second polymer are not dienes. Block copolymers formed from the aforementioned first and second polymers may be used individually and in combinations thereof in accordance with the method of the present invention. The molecular weight of each block of the block copolymer may be in a range from about 1,500 g/mol to about 50,000 g/mol. For example, for a PS-b-PEO block copolymer, the PS may have a molecular weight in a range from about 3.0 kilograms/mole (kg/mol) to about 19.0 kg/mol, and the poly(ethylene oxide) may have a molecular weight in a range from about 4.0 kg/mol to about 12.0 kg/mol.

Step 110 provides additional material which may be selectively miscible with the first polymer of the block copolymer. For example, the additional material may be an organosilicate precursor, such as a copolymer of methyltrimethoxysilane and tetraethylorthosilicate, where the organosilicates may have a higher miscibility in the first polymer of the block copolymer. In the block copolymer example above, the organosilicate may be selectively miscible in the PEO block of the PS-b-PEO block copolymer. The block copolymer may be configured such that the block in which the additional material is selectively miscible, is not a diene.

The use of the copolymer of methyltrimethoxysilane and tetraethylorthosilicate as the additional material in this example is not meant to limit the type of additional material that may be used in embodiments of the present invention. The additional material may be an inorganic material. Other materials that may be used include, but are not limited to an inorganic homopolymer, a crosslinkable homopolymer, a combination thereof, and the like. The crosslinkable homopolymer may be a silsesquioxane having the general formula $(RSiO_{1.5})_n$, wherein R may be a hydrido group or an alkyl group having 1 to 3 carbon atoms, wherein n may be in a range from about 10 to about 500, and wherein the crosslinkable homopolymer may have a molecular weight in a range from about 600 g/mol to about 30,000 g/mol. Other crosslinkable homopolymers may include inorganic crosslinkable polymers; polysilanes; polygermanes; polysirazanes; carbosilanes; borazoles; carboranes; amorphous silicon carbides; and the like. The aforementioned crosslinkable polymers may be used individually or in combinations thereof in accordance with the method of the present invention.

In step 115, the block copolymer and the additional material may be combined to form a combination of block copolymer and the additional material. The additional material may selectively migrate to block copolymer domains in which the additional material is selectively miscible, such as the first polymer block for example. In the case of a silicon-containing additional material, the combination may have silicon-rich block copolymer domains (those domains where the additional material is selectively miscible) and silicon poor block copolymer domains (those domains wherein the additional material is not selectively miscible). For example, in one embodiment blocks of the first polymer may have at least 7 weight percent silicon while blocks of the second polymer may have less than 4 weight percent silicon.

In step 120, a first layer may be adhered to the surface of a substrate, where the first layer may comprise an organic compound. The first layer may comprise a pattern transfer layer comprising a hydroxystyrene-based crosslinkable polymer, polydimethylglutarimide, poly(vinylbenzoic acid), polyhydroxystyrenes, polyimides, or a combination thereof. In one embodiment, the first layer may be an organic interlayer planarization layer.

In step 125, a film of the combination formed in step 115 is formed directly onto a surface of the first layer. In response to forming the film, nanostructures of the additional material may self-assemble within the first polymer block and self-align perpendicular to the surface of the first layer, since the block copolymer may form aligned segregated structures of the first polymer block (containing the additional material) and the second polymer block. The resulting morphology of the additional material nanostructures may be controlled by varying factors which may change the morphology of the block copolymer segregated structures, such as the molecular weights and compositions of the first and second blocks of the block copolymer The combination of the block copolymer and the additional material may be formed in a solvent solution and cast as a solution, which may require solvent removal for complete film formation. A thin film of the combination may be spin coated onto a substrate, where a spin speed may be in a range from about 50 rpm to about 5,000 rpm. The combination may be spin coated at room temperature without a post-drying process. Alternatively, a film sample on a substrate may be thermally annealed, after forming the film, at a temperature of about 100° C. for about 10 hours, for example. Also, a film sample on a substrate may be vapor annealed, after forming the film on the substrate, by annealing the adhering film under organic solvent vapor at room temperature (about 25° C.) from about 10 hours to about 15 hours, for example. Nanostructures comprising the additional material may self-assemble during or after film formation on a substrate or layers deposited thereon.

The spin coating process used is not meant to limit the type of processes that may be used in an embodiment of the present invention. Other processes such as chemical vapor deposition (CVD), photochemical irradiation, thermolysis, spray coating, dip coating, doctor blading, and the like may be used individually and in combinations thereof in accordance with the method of the present invention.

The formation of the self-assembled nanostructures may be accomplished by forming the film on the substrate, thermal annealing after forming the film on the substrate, vapor annealing after forming said film on the substrate, a combination thereof, or any other process which provides a means for forming the structures.

Figure 2:
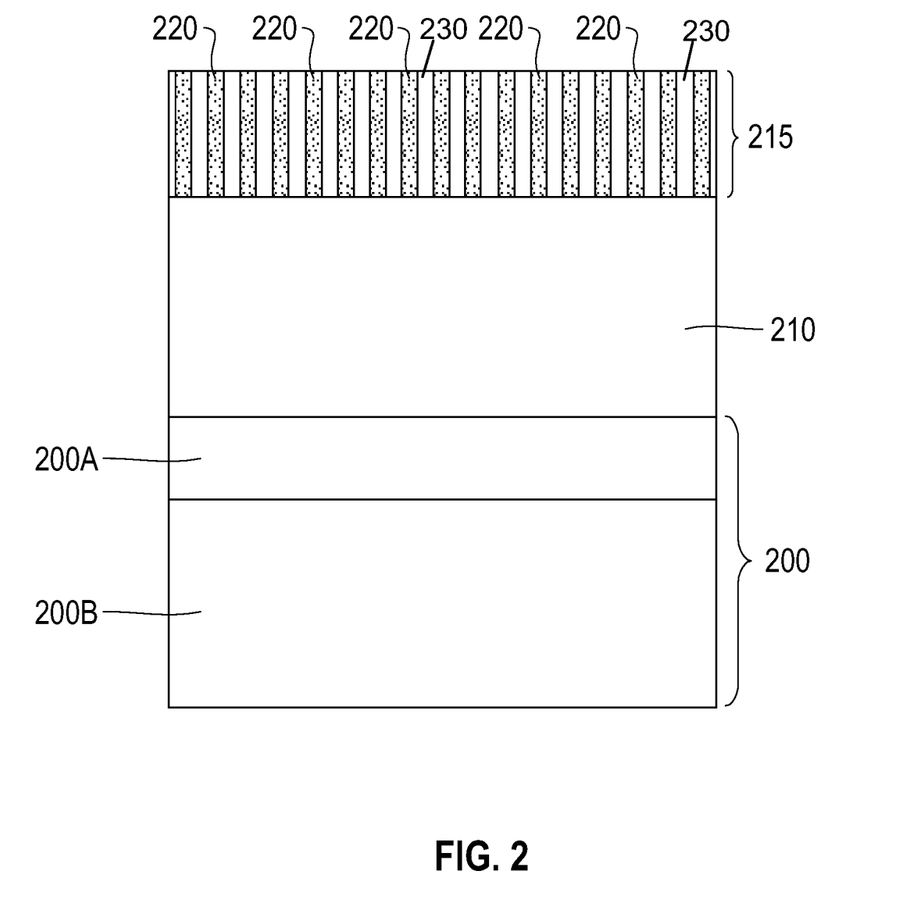
FIG. 2 is an illustration of an embodiment of the present invention comprising a substrate having a first layer adhered onto a surface of the substrate, in accordance with embodiments of the present invention.

FIG. 2 is an illustration of an embodiment of the present invention comprising a substrate 200 having a first layer 210 adhered onto a surface of the substrate 200, where a film 215 comprising a combination of a block copolymer and additional material has been formed over a surface of the first layer 210. The substrate 200 may comprise a single layer. The substrate 200 may comprise a plurality of layers, such as substrate layers 200A and 200B in the embodiment illustrated in FIG. 2. Nanostructures 220 of the additional material may self-assemble within the film 215 of the combination upon formation of the film 215 on the surface of the first layer 210. The film 215 comprises a nanostructure 220 and a nanostructural element 230 alternating with respect to each other in a direction parallel to the top surface of the substrate 200 to form a repeating pattern of the nanostructure and the nanostructural element. The nanostructures 220 may comprise the additional material in the first polymer block of the block copolymer. The nanostructural elements 230 may comprise the additional material in the second polymer block of the block copolymer.

Referring to FIG. 1, in step 130 the film of the combination and the first layer may be etched simultaneously. For example, the film of the combination and the first layer may be etched in a single etching step. The etching may utilize an etchant such as a gas plasma of oxygen, argon, helium, the like, or a combination thereof. The nanostructures may have an etch rate (e.g. rate at which an amount or thickness of material is removed per unit of time) which is lower than that of the first layer and which is lower than the etch rate of the block copolymer. The rate of the etch rate of the block copolymer to the etch rate of the nanostructures may be greater than 5:1, such as greater than 100:1. For example, the etch rate of polystyrene in an oxygen plasma may be about 2.7 nm/second whereas the etch rate of the organosilicate under the same conditions may be less than about 0.03 nm/second. In such a case, as the block copolymer is etched away more rapidly that the nanostructures, the nanostructures will act as an in-situ mask to block the etching of areas of the first layer directly beneath the nanostructures. Simultaneously etching the first layer and the film of the combination may thus result in removal of the film (or portions thereof) and leaving features on the surface of the first layer.

Figure 3:
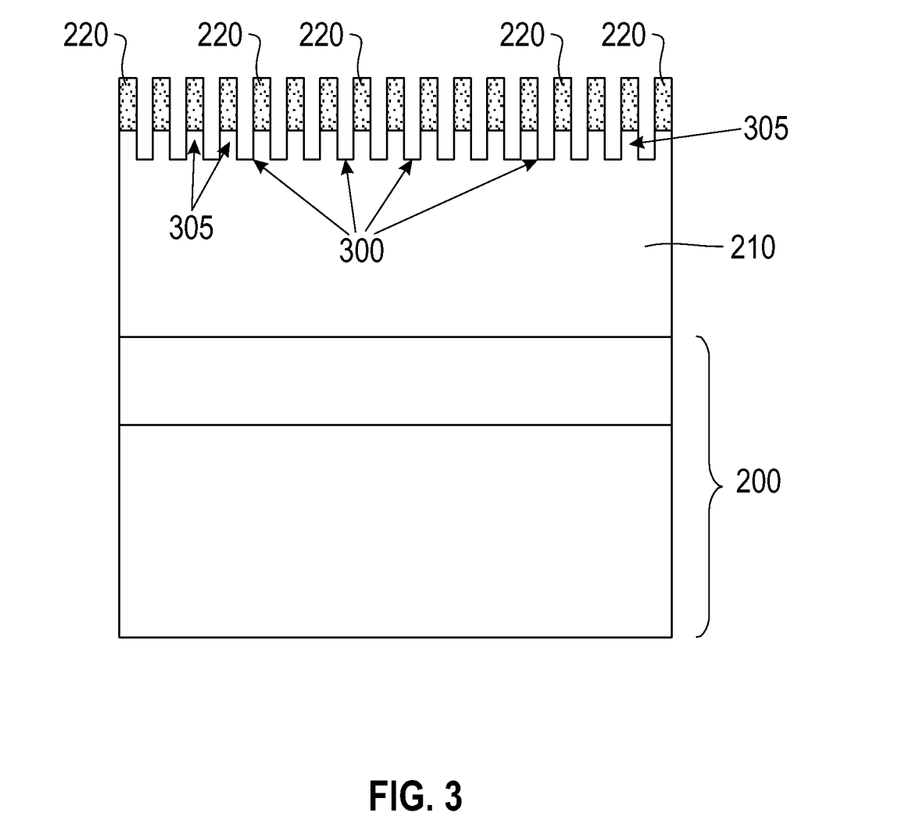
FIG. 3 is an illustration of the embodiment of FIG. 2 after the block copolymer of the film of the combination in FIG. 2 has been substantially removed, in accordance with embodiments of the present invention.

FIG. 3 is an illustration of the embodiment of FIG. 2 after the block copolymer of the film 215 of the combination in FIG. 2 has been removed, where the nanostructures 220 remain and mask the portions 305 of the first layer 210 directly beneath the nanostructures 220. After the etching process etches away (removes) the block copolymer and while the etchant continues to more slowly etch the nanostructures 220, the etchant may continue to etch the areas 300 of the first layer which are not masked by the nanostructures 220. As the process completes, the nanostructures 220 may be etched away to leave intact portions 305 of the first layer 210 which were masked by the nanostructures 220 and to leave features on the surface of the first layer 210, where the etchant removed unmasked areas 300 of the first layer 210.

Figure 4:
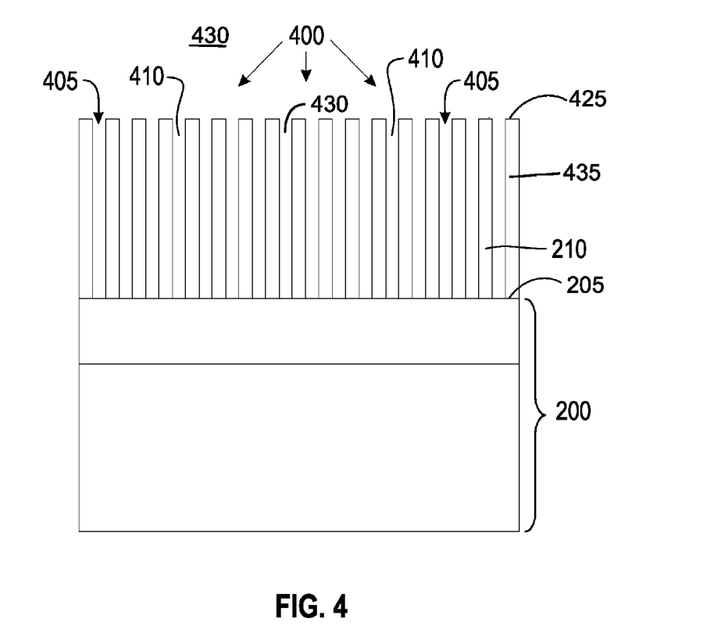
FIG. 4 is an illustration of the embodiment of FIG. 2 after the film of the combination has been removed by the etching step of FIG. 1, in accordance with embodiments of the present invention.

FIG. 4 is an illustration of the embodiment of FIG. 2 after the film 215 of the combination (or portions thereof) has been removed by the etching step 130 of FIG. 1. Features 400 remain on a surface of the first layer 210 as holes (i.e. hole regions) 405 and within in the first layer 210 as nanopores 410. Each hole region 405 is disposed between successive nanoshapes 435. Each hole region 405 includes therein a portion of a surrounding ambient atmosphere 430. The top surface 425 of each nanoshape 435 is directly exposed to the surrounding ambient atmosphere 430.

EXAMPLE 1

Propylene glycol mono methyl ether acetate (PGMEA) was used to make 1% by weight (wt %) solutions of each of PS-b-PEO and an organosilicate. The organosilicate precursor (PMS) was a copolymer of methyltrimethoxysilane and tetraethylorthosilicate with an approximate molecular weight of 2000 grams/mole (g/mol). The two solutions were combined with the block copolymer PS-b-PEO in a PS-b-PEO/PMS ratio of about 30/70 weight/weight (wt/wt). The PS-b-PEO (obtained from Polymer Source, Inc.) comprised a first block of a first polymer, PEO, and a second block of a second polymer, PS, where the molecular weight of the PS block was about 19.0 kg/mol, and the molecular weight of the PEO block was about 12.3 kg/mol. A hydroxystyrene-based crosslinkable polymer (NFC1400, JSR Micro) or polydimethylglutarimide (PMGI, MicroChem) was used to spin-cast a 180 nm thick transfer layer onto a clean Si (100) wafer substrate. The substrate with transfer layer was baked for 1 minute at 190° C. The combination solution was spun-cast at about 1000 rpm onto a surface of the transfer layer on the substrate under chloroform vapor.

The layered samples were etched using an anisotropic oxygen plasma for about 60 seconds in a Surface Technology Systems Multiplex tool, which utilizes an inductively coupled plasma configuration. The oxygen pressure was about 6 milliTorr (mTorr), the oxygen flow rate was about 30 standard cubic centimeters/minute (sccm), the coil power was about 300 watts (W), the platen power was about 20 W, and the sample temperature was held at approximately 20° C.

Figure 5:
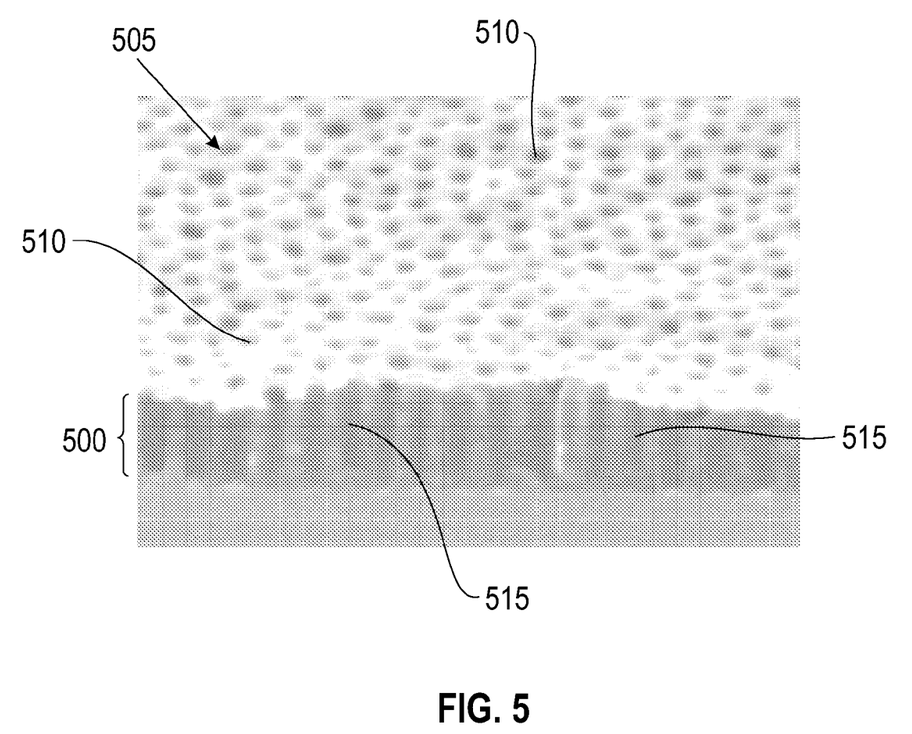
FIG. 5 is a tilted SEM image of a cross-section of a sample showing the transfer layer after etching, in accordance with embodiments of the present invention.

FIG. 5 is a tilted SEM image of a cross-section of the sample prepared above showing the transfer layer 500, where features 505 (shown as an array of holes 510 and cylindrical nanopores 515 oriented perpendicular to the surface of the thick organic transfer layer 500) remain on the surface of the transfer layer 500 and within the transfer layer 500 after removal of the block copolymer layer by etching.

EXAMPLE 2

Figure 6:
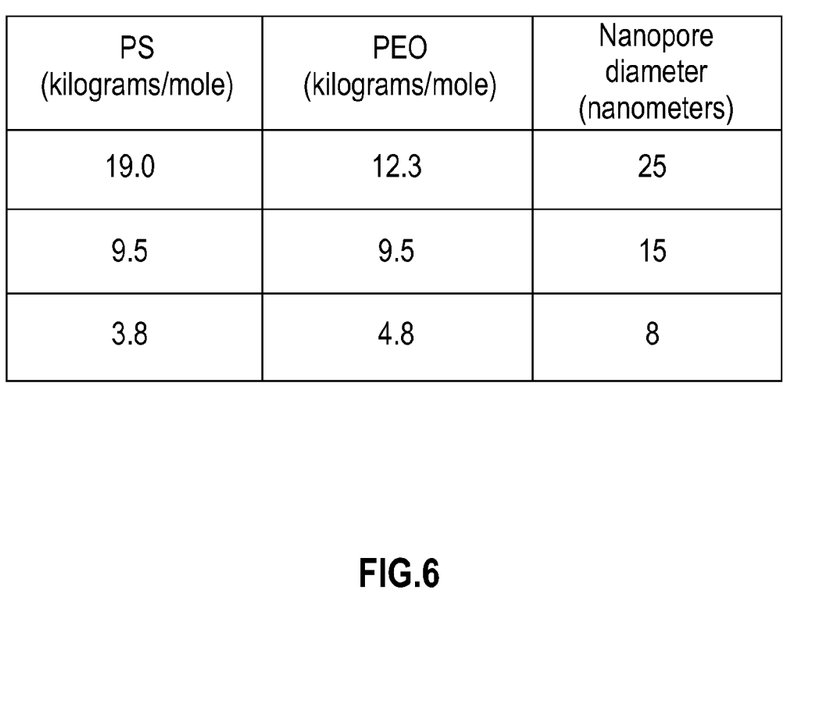
FIG. 6 is a table illustrating a range of molecular weights for PS and PEO in the PS-b-PEO block copolymer used to form nanopores in a transfer layer, in accordance with embodiments of the present invention.

The size of the resulting nanopores may be controlled by changing the molecular weights of the first and second blocks of the block copolymer. FIG. 6 is a table illustrating a range of molecular weights for PS and PEO in the PS-b-PEO block copolymer used to form nanopores in a transfer layer as described in Example 1. The molecular weights of PS-b-PEO range from PS19k-b-PEO12.3 k (19 kg/mol for PS and 12.3 kg/mol for PEO) to PS9.5 k-b-PEO9.5 k (9.5 kg/mol for PS and 9.5 kg/mol for PEO) to PS3.8 k-b-PEO4.8 k (3.8 kg/mol for PS and 4.8 kg/mol for PEO), and resulted in nanopore diameters of 25 nm, 15 nm, and 8 nm respectively.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed:

1. A method for producing surface features, comprising:
   providing a combination of a block copolymer with additional material, said block copolymer comprising a first block of a first polymer, said first block being covalently bonded to a second block of a second polymer to form a repeating unit of the block copolymer, said first and second polymers being different, said additional material being selectively miscible with said first polymer;
   adhering a first layer onto a surface of a substrate, wherein said first layer comprises an organic compound;
   forming a film of said combination directly onto a surface of said first layer, wherein in response to said forming, nanostructures of said additional material self-assemble within said first polymer block, said nanostructures self-aligning perpendicular to said surface of said first layer; and
   etching said film of said combination and said first layer, said nanostructures having an etch rate lower than an etch rate of said block copolymer with respect to said etching, said nanostructures having an etch rate lower than an etch rate of said first layer with respect to said etching, wherein completion of said etching results in: (i) removal of all of said film and a first portion of said first layer, (ii) leaving a remaining portion of said first layer comprising a plurality of nanoshapes on said surface of said substrate such that said nanoshapes are distributed in a first direction that is parallel to the surface of the substrate, (iii) leaving a plurality of hole regions distributed in the first direction such that each hole region is disposed between successive nanoshapes of said plurality of nanoshapes, and (iv) leaving said substrate unetched by said etching, wherein said nanoshapes are encompassed in their entirety by the remaining portion of said first layer, wherein each hole region includes therein a portion of a surrounding ambient atmosphere, and wherein said removal of all of said film results in a top surface of each nanoshape being directly exposed to said surrounding ambient atmosphere.

2. The method of claim 1, wherein said first layer comprises a hydroxy styrene-based cross linkable polymers.

3. The method of claim 1, wherein said first layer comprises a polyhydroxystyrenes.

4. The method of claim 1, wherein said block copolymer is an organic block copolymer of polystyrene and poly(ethylene oxide).

5. The method of claim 1, wherein said additional material is an organosilicate precursor.

6. The method of claim 5, wherein said additional material is a copolymer of methylmethoxysilane and tetraethylorthosilicate.

7. The method of claim 1, wherein said first layer comprises polydimethylglutarimide.

8. The method of claim 1, wherein said first layer comprises a polyimide.

9. The method of claim 1, wherein said first layer comprises poly(vinylbenzoic acid).

10. The method of claim 1, wherein the nanostructures of said additional material have a morphology, and wherein the method further comprises:
    controlling the morphology of the nanostructures of said additional material by selecting the first block of the first polymer and the second block of the second polymer based on the molecular weight and composition of the first block of the first polymer and the molecular weight and composition of the second block of the second polymer.

11. The method of claim 1, said formed film comprising nanostructural elements and said nanostructures alternating with respect to each other in the first direction to form a repeating pattern of the nanostructures and the nanostructural elements, said formed film comprising the additional material in the first block of the first polymer and in the second block of the second polymer.

12. An etch masking method, comprising:
    forming a first film on a surface of a substrate, wherein said first film comprises an organic compound;

forming a second film over said first film, said second film comprising a combination of a block copolymer and an inorganic material, said block copolymer comprising a first block of a first polymer and a second block of a second polymer, said inorganic material selectively miscible in said first block of said first polymer, wherein nanostructures of said inorganic material self-assemble in said first block of said block copolymer after said forming said second film; and etching by an etchant simultaneously said combination and said first film, said nanostructures having an etch rate lower than said first film with respect to said etching, said nanostructures having an etch rate lower than said block copolymer with respect to said etching, wherein completion of said etching results in: (i) removal of all of said second film and a first portion of said first film, (ii) leaving a remaining portion of said first film comprising a plurality of nanoshapes on said surface of said substrate such that said nanoshapes are distributed in a first direction that is parallel to the surface of the substrate, (iii) leaving a plurality of hole regions distributed in the first direction such that each hole region is disposed between successive nanoshapes of said plurality of nanoshapes, and (iv) leaving said substrate unetched by said etching, wherein said nanoshapes are encompassed in their entirety by the remaining portion of said first film, wherein each hole region includes therein a portion of a surrounding ambient atmosphere, and wherein said removal of all of said film results in a top surface of each nanoshape being directly exposed to said surrounding ambient atmosphere.

13. The method of claim 12, wherein said first film comprises poly(vinylbenzoic acid).

14. The method of claim 12, wherein said first film comprises a polyhydroxystyrene.

15. The method of claim 12, wherein said inorganic material comprises a copolymer of methylmethoxysilane and tetraethylorthosilicate.

16. The method of claim 12, wherein said first film comprises a hydroxy styrene-based cross linkable polymer.

17. The method of claim 12, wherein said first film comprises a polyimide.

18. The method of claim 12, wherein said first film comprises polydimethylglutarimide.

19. The method of claim 12, wherein the nanostructures of said inorganic material have a morphology, and wherein the method further comprises:

controlling the morphology of the nanostructures of said inorganic material by selecting the first block of the first polymer and the second block of the second polymer based on the molecular weight and composition of the first block of the first polymer and the molecular weight and composition of the second block of the second polymer.

20. The method of claim 12, said second formed film comprising nanostructural elements and said nanostructures alternating with respect to each other in the first direction to form a repeating pattern of the nanostructures and the nanostructural elements, said second formed film comprising the inorganic material in the first block of the first polymer and in the second block of the second polymer.

* * * * *